United States Patent
Lee et al.

(10) Patent No.: US 10,928,859 B2
(45) Date of Patent: Feb. 23, 2021

(54) STRETCHABLE DISPLAY DEVICE

(71) Applicant: LG Display Co., Ltd., Seoul (KR)

(72) Inventors: Suhun Lee, Gimpo-si (KR); DongSeok Lee, Bucheon-shi (KR); SangChul Ryu, Gumi-si (KR); MyungJoon Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/600,434

(22) Filed: Oct. 11, 2019

(65) Prior Publication Data

US 2020/0133343 A1  Apr. 30, 2020

(30) Foreign Application Priority Data

Oct. 31, 2018  (KR) .................. 10-2018-0132607

(51) Int. Cl.
*G06F 1/16* (2006.01)
*F21V 8/00* (2006.01)

(52) U.S. Cl.
CPC .......... *G06F 1/1652* (2013.01); *G02B 6/0028* (2013.01); *G02B 6/0043* (2013.01); *G02B 6/0073* (2013.01)

(58) Field of Classification Search
None
See application file for complete search history.

(56) References Cited

U.S. PATENT DOCUMENTS

| | | |
|---|---|---|
| 9,391,286 B1 | 7/2016 | Kwon et al. |
| 2016/0240802 A1 | 8/2016 | Lee |
| 2016/0268352 A1 | 9/2016 | Hong et al. |
| 2016/0320878 A1 | 11/2016 | Hong et al. |
| 2017/0003440 A1* | 1/2017 | Kim .................. G02B 6/0065 |
| 2017/0040306 A1 | 2/2017 | Kim et al. |
| 2020/0212117 A1* | 7/2020 | Jeon .................. H01L 25/167 |

FOREIGN PATENT DOCUMENTS

| | | |
|---|---|---|
| CN | 108227281 A | 6/2018 |
| JP | 2011-517370 A | 6/2011 |
| JP | 2015-164177 A | 9/2015 |
| JP | 2018-066933 A | 4/2018 |
| KR | 10-2018-0011812 A | 2/2018 |

OTHER PUBLICATIONS

Japanese Office Action dated Sep. 17, 2020 issued in Patent Application No. 2019-196968 w/machine translation (10 pages).

* cited by examiner

*Primary Examiner* — Britt D Hanley
(74) *Attorney, Agent, or Firm* — Polsinelli PC

(57) ABSTRACT

A display device comprises a plurality of island substrates spaced apart from one another and having a plurality of display elements disposed thereon; a lower substrate supporting the plurality of island substrates and the lower substrate being more flexible than the plurality of island substrates; a plurality of connection lines electrically connecting between the island substrates; and a light-transmitting unit disposed on the island substrates and the lower substrate and transmitting light from the plurality of display elements.

19 Claims, 8 Drawing Sheets

STRETCHABLE DISPLAY DEVICE

CROSS REFERENCE TO RELATED APPLICATION

This application claims the priority of Korean Patent Application No. 10-2018-0132607 filed on Oct. 31, 2018, which is hereby incorporated by reference in its entirety.

BACKGROUND

Field of the Disclosure

The present disclosure relates to a display device, and more particularly, to a stretchable display device. Although the present disclosure is suitable for a wide scope of applications, it is particularly suitable for improving an aperture ratio and maintaining image quality of the stretchable display device even in a stretched state.

Description of the Background

Display devices employed by the monitor of a computer, a TV, a mobile phone or the like include an organic light-emitting display (OLED) that emits light by itself, and a liquid-crystal display (LCD) that requires a separate light source.

Such display devices find more and more applications, including computer monitors and televisions, as well as personal portable devices. Accordingly, research is ongoing to develop display devices having a larger active area with reduced volume and weight.

Recently, stretchable display devices are drawing attention as one of the next generation display devices. These stretchable display devices are fabricated by forming a display and lines on a flexible substrate made of a flexible material such as plastic so that they can be expanded and contracted in a particular direction and can be changed into various shapes.

A stretchable display device may be referred to as a display device capable of displaying an image even if it is bent or stretched. A stretchable display device may have a higher flexibility than existing typical display devices. Accordingly, the shape of a stretchable display device can be changed as a user desires, such as the user bends or stretches the stretchable display device. For example, if a user grasps an end of a stretchable display device and pulls it, the stretchable display device can be stretched by the user's force. Alternatively, when a user places stretchable display device on an uneven wall, the stretchable display device can be bent along the shape of the surface of the wall. In addition, when the force exerted by the user is removed, the stretchable display device can be returned to its original shape.

Such a stretchable display device is implemented such that it has rigid regions and a flexible region. Specifically, in the rigid regions, the display elements are disposed to emit light actually. The flexible region is stretched when a force is applied to the stretchable display device.

As described above, when a stretchable display device is stretched, it is not uniformly stretched but only the flexible region is stretched. Therefore, the distance between the rigid regions is increased when the stretchable display device is stretched, and the distance between the display elements is also increased accordingly. Thus, the flexible region becomes larger than the rigid regions as the distance between the display elements is increased when the stretchable display device is stretched, and thus the density of the emission zones in the stretchable display device is reduced. As a result, the image quality deteriorates. Further, it is more likely that a viewer may perceive a lattice pattern when the stretchable display device is stretched.

The above information disclosed in this Background section is only for enhancement of understanding of the background of the described technology and therefore it may contain information that does not form prior art that is already known in this country to a person of ordinary skill in the art.

SUMMARY

In view of the above, the inventors of the present disclosure have recognized such problems of stretchable display devices and have devised a stretchable display device having a novel structure to solve the problems.

In view of the above, the present disclosure provides a stretchable display device that can suppress the image quality from deteriorating when it is stretched by way of disposing a light-transmitting unit for transmitting light emitted from a plurality of display elements on a lower substrate.

Another aspect of the present disclosure provides a stretchable display device that can reduce Mura artifacts such as a lattice pattern when it is stretched by way of guiding light emitted from a plurality of display elements to regions between a plurality of island substrates.

Yet another aspect of the present disclosure provides a stretchable display device that can suppress color mixture of light that is emitted from a plurality of display elements and guided to regions between a plurality of island substrates.

The present disclosure is not limited to the above-mentioned objects, and other objects, which are not mentioned above, can be clearly understood by those skilled in the art from the following descriptions.

According to an aspect of the present disclosure, there is provided a display device comprises a plurality of island substrates spaced apart from one another and having a plurality of display elements disposed thereon; a lower substrate supporting the plurality of island substrates and the lower substrate being more flexible than the plurality of island substrates; a plurality of connection lines electrically connecting between the island substrates; and a light-transmitting unit disposed on the island substrates and the lower substrate and transmitting light from the plurality of display elements.

According to another aspect of the present disclosure, there is provided a display device comprises a lower substrate; a plurality of island substrates disposed on the lower substrate; a plurality of display elements disposed to respectively correspond to the plurality of island substrates; a plurality of partition walls disposed on the lower substrate and configured to change a path of light emitted from the plurality of display elements; and a light-transmitting layer disposed on the plurality of island substrates, the plurality of display elements and the plurality of partition walls and configured to guide the light emitted from the plurality of display elements.

Other detailed matters of the exemplary aspects are included in the detailed description and the drawings.

According to an exemplary aspect of the present disclosure, the light emitted from a plurality of display elements can be transmitted to regions between a plurality of island substrates, and the size of emission zones where the light emitted from the display elements exits can be increased.

According to an exemplary aspect of the present disclosure, the light emitted from a plurality of display elements can be transmitted to side portions of the display elements, and it is possible to prevent a decrease in luminance caused as the distance between a plurality of sub-pixels is increased when the stretchable display device is stretched.

According to an exemplary aspect of the present disclosure, a number of sub-light-transmitting layers covering a plurality of display elements emitting lights of different colors are spaced apart from one another, such that it is possible to suppress color mixture of lights guided toward the side portions of a plurality of display elements.

According to an exemplary aspect of the present disclosure, light emitted from each of display elements is transmitted to the respective one of a plurality of sub-light-transmitting layers, such that the color purity can be improved.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
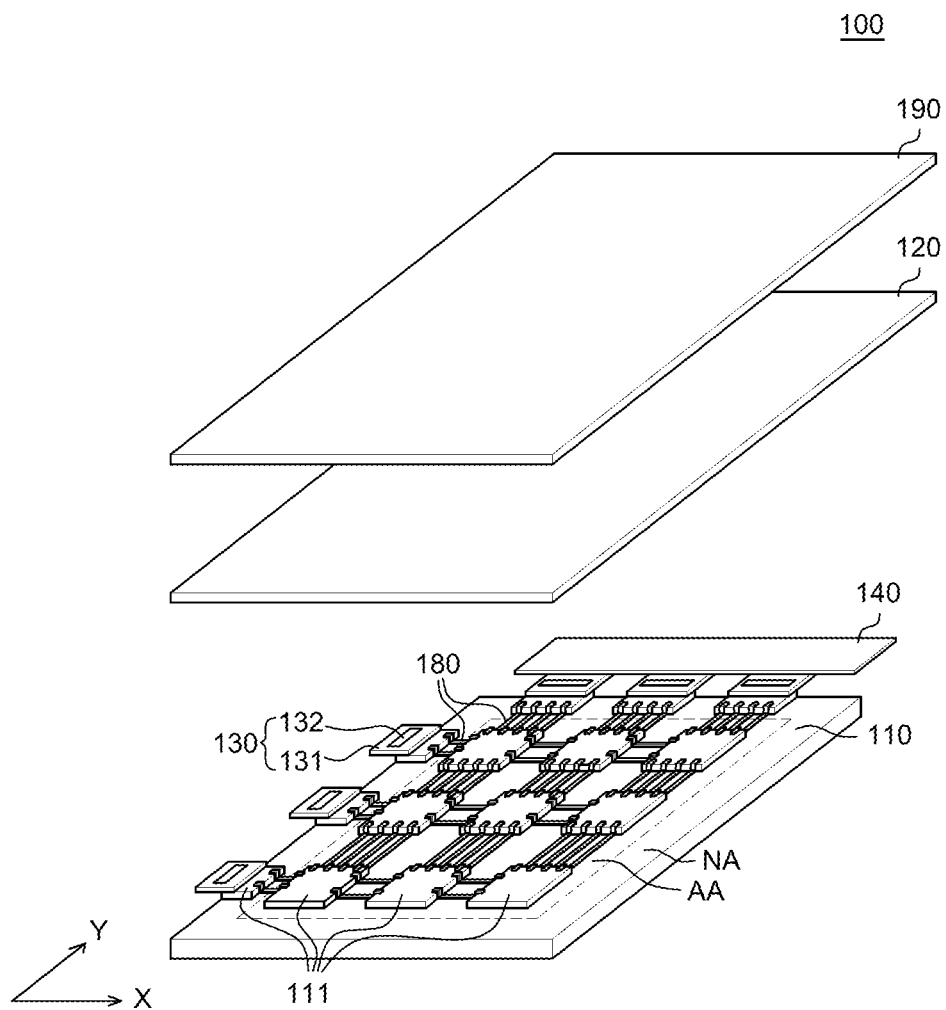
FIG. 1 is an exploded perspective view of a stretchable display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a stretchable display device according to exemplary aspects of the present disclosure will be described in detail with reference to accompanying drawings.

FIG. 1 is an exploded perspective view of a stretchable display device according to an exemplary aspect of the present disclosure. Referring to FIG. 1, a stretchable display device 100 includes a lower substrate 110, a plurality of island substrates 111, a plurality of connection lines 180, a chip-on-film (COF) 130, a printed circuit board 140, an upper substrate 120, and a polarizing layer 190. In FIG. 1, a second adhesive layer for bonding the lower substrate 110 and the upper substrate 120 to each other is not shown for convenience of illustration.

The lower substrate 110 supports and protects a variety of elements of the stretchable display device 100. The lower substrate 110 may be made of an insulating material that can be bent or stretched as a flexible substrate. For example, the lower substrate 110 may be made of an elastomer such as polyurethane (PU) and a silicone rubber such as polydimethylsiloxane (PDMS) accordingly can have flexibility. It is, however, to be understood that the material of the lower substrate 110 is not limited thereto.

The lower substrate 110 may be a flexible substrate and may be reversibly expanded and contracted. In addition, the elastic modulus may be several MPa to several hundred MPa, and the elongation ratio may be 100% or higher. The thickness of the lower substrate 110 may be, but is not limited to, 10 μm to 1 mm.

The lower substrate 110 may have an active area AA and a non-active area NA surrounding the active area AA.

The active area AA is where images are displayed in the stretchable display device 100, and display elements and a variety of driving elements for driving the plurality of display elements are disposed. The active area AA includes a plurality of pixels each including a plurality of sub-pixels. The plurality of pixels is disposed in the active area AA and includes a plurality of display elements. Each of the plurality of sub-pixels may be connected to a variety of lines. For example, each of the sub-pixels may be connected to a variety of lines such as a gate line, a data line, a high-voltage supply line, a low-voltage supply line, a reference voltage line, and a common line.

The non-active area NA is adjacent to the active area AA. The non-active area NA is adjacent to and surrounds the active area AA. In the non-active area NA, no image is displayed, and lines, circuitry, etc. may be formed. For example, a plurality of pads may be disposed in the non-active area NA. The pads may be connected to the plurality of sub-pixels in the active area AA.

The plurality of island substrates 111 is disposed on the lower substrate 110. The island substrates 111 are rigid substrates and are spaced apart from one another on the lower substrate 110. The island substrates 111 may be more rigid than the lower substrate 110. In other words, the lower substrate 110 may be more flexible than the island substrates 111, and the island substrates 111 may be more rigid than the lower substrate 110.

The island substrates 111, which are rigid substrates, may be made of a plastic material having flexibility, and may be made of, for example, polyimide (PI), polyacrylate, polyacetate, etc.

The modulus of the island substrates 111 may be higher than the modulus of the lower substrate 110. As used herein, the modulus refers to a modulus of elasticity which indicates a quantity that measures a substrate's resistance to being deformed elastically when a stress is applied to it. The higher the modulus is, the higher the hardness is. Accordingly, the island substrates 111 may be rigid substrates having rigidity as compared with the lower substrate 110. The modulus of the island substrates 111 may be, but is not limited to, 1,000 times larger than the modulus of the lower substrate 110.

As the island substrates 111 having rigidity are arranged on the lower substrate 110, portions of the lower substrate 110 overlapping the island substrates 111 may be defined as rigid regions due to the island substrates 111. The other portions of the lower substrate 110 which do not overlap with the island substrates 111 are defined as a flexible region because there is only the lower substrate 110. That is to say, the portions of the lower substrate 110 where the island substrates 111 are arranged may be defined as rigid regions, while the other portions of the lower substrate 110 where the island substrates 111 are not arranged may be defined as a flexible region. Since the island substrates 111 are spaced apart from one another, the rigid regions may also be spaced apart from one another. The flexible region may surround the rigid regions.

In some exemplary aspects, the portions of the lower substrate 110 in the rigid regions may have a higher modulus than the portions in the flexible region. That is to say, the portions of the lower substrate 110 overlapping the island substrates 111 may be made of a material having a modulus similar to that of the island substrates 111, whereas the other portions of the lower substrate 110 not overlapping the island substrates 111 may be made of a modulus lower than that of the island substrates 111.

The plurality of connection lines 180 is disposed between the island substrates 111. The connection lines 180 may be disposed between the pads disposed on the island substrates 111 to electrically connect between the pads. The connection lines 180 will be described in more detail with reference to FIG. 2.

The COF 130 is an element for supplying signals to the plurality of sub-pixels in the active area AA, in which a variety of components are disposed on a flexible base film 131. The COF 130 may be bonded to a plurality of pads arranged in the non-active area NA and may provide a plurality of sub-pixels in the active area AA with the supply voltage, data voltage, gate voltage, etc. through the pads. The COF 130 may include the base film 131 and a driver IC 132, and a variety of other elements may be disposed thereon.

The base film 131 is a layer for supporting the driver IC 132 of the COF 130. The base film 131 may be made of an insulating material, for example, an insulating material having flexibility.

The driver IC 132 is an element for processing data for displaying image and driving signals for processing the data. Although the driver IC 132 is mounted as the COF 130 in the example shown in FIG. 1, it is to be understood that the driver IC 132 may also be mounted by a chip-on-glass (COG), a tape-carrier-package (TCP), etc.

A control unit such as an IC chip and circuitry may be mounted on the printed circuit board 140. A memory, a processor, etc. may also be mounted on the printed circuit board 140. The printed circuit board 140 transmits signals for driving the display elements from the control unit to the display elements.

The printed circuit board 140 may be connected to the COF 130 to be electrically connected to each of the sub-pixels on the island substrates 111.

The upper substrate 120 overlaps with the lower substrate 110 and protects a variety of elements of the stretchable display device 100. The upper substrate 120 may be made of an insulating material that can be bent or stretched as a flexible substrate. For example, the upper substrate 120 may be made of a flexible material and may be made of the same material as the lower substrate 110, but the present disclosure is not limited thereto.

The polarizing layer 190 is an element for suppressing reflection of external light in the stretchable display device 100 and may be disposed on the upper substrate 120 to overlap with it. It is, however, to be understood that the present disclosure is not limited thereto. The polarizing layer 190 may be disposed under the upper substrate 120 or may be eliminated depending on the structure of the stretchable display device 100.

Hereinafter, the stretchable display device 100 according to an exemplary aspect of the present disclosure will be described in more detail with reference to FIGS. 2 and 3.

Figure 2:
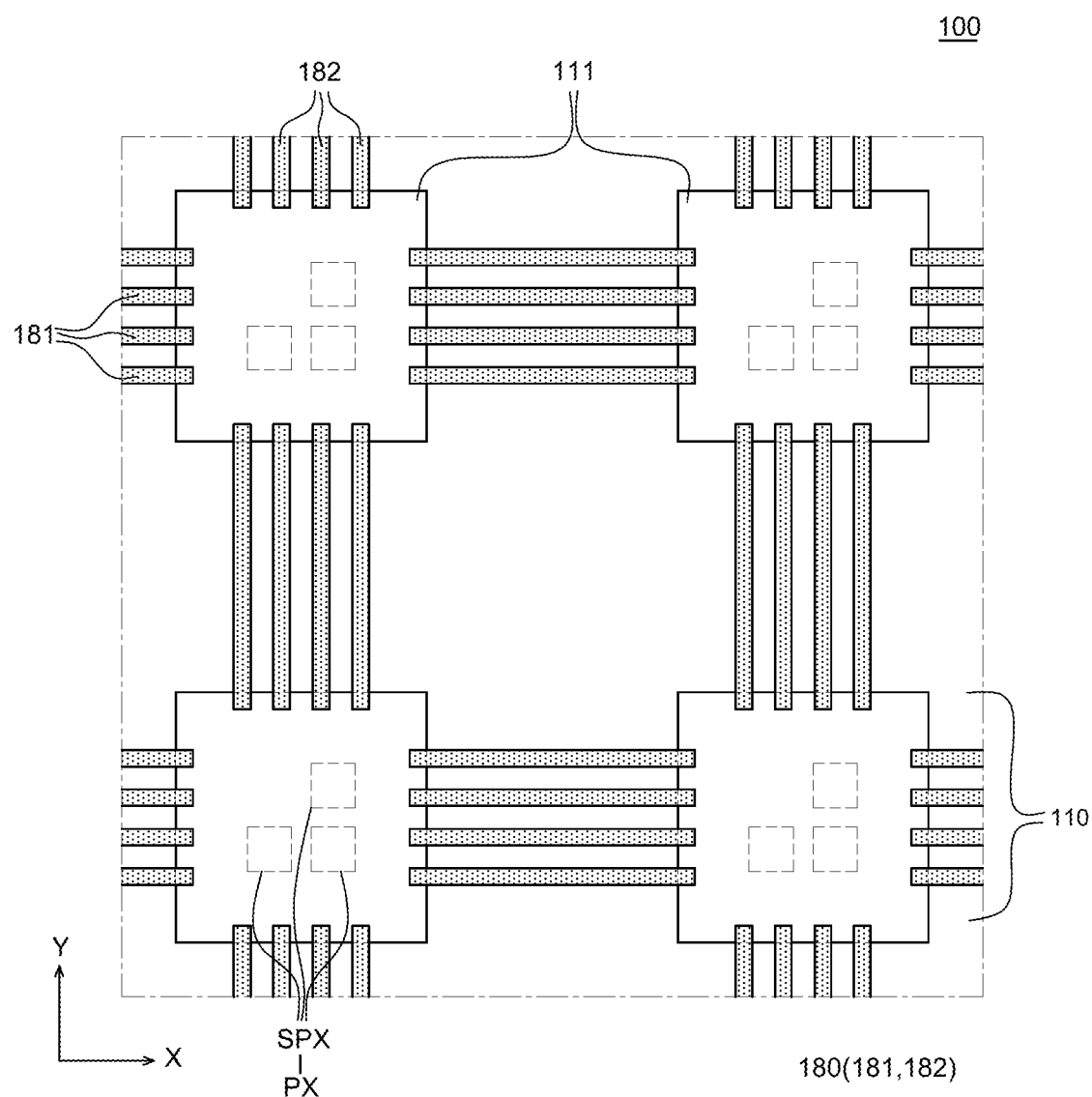
FIG. 2 is an enlarged plan view of a stretchable display device according to an exemplary aspect of the present disclosure.

FIG. 2 is an enlarged plan view of a stretchable display device according to an exemplary aspect of the present disclosure. FIG. 3 is a schematic cross-sectional view showing a sub-pixel of FIG. 1. For convenience of illustration, description will be made with reference to FIG. 1.

Figure 3:
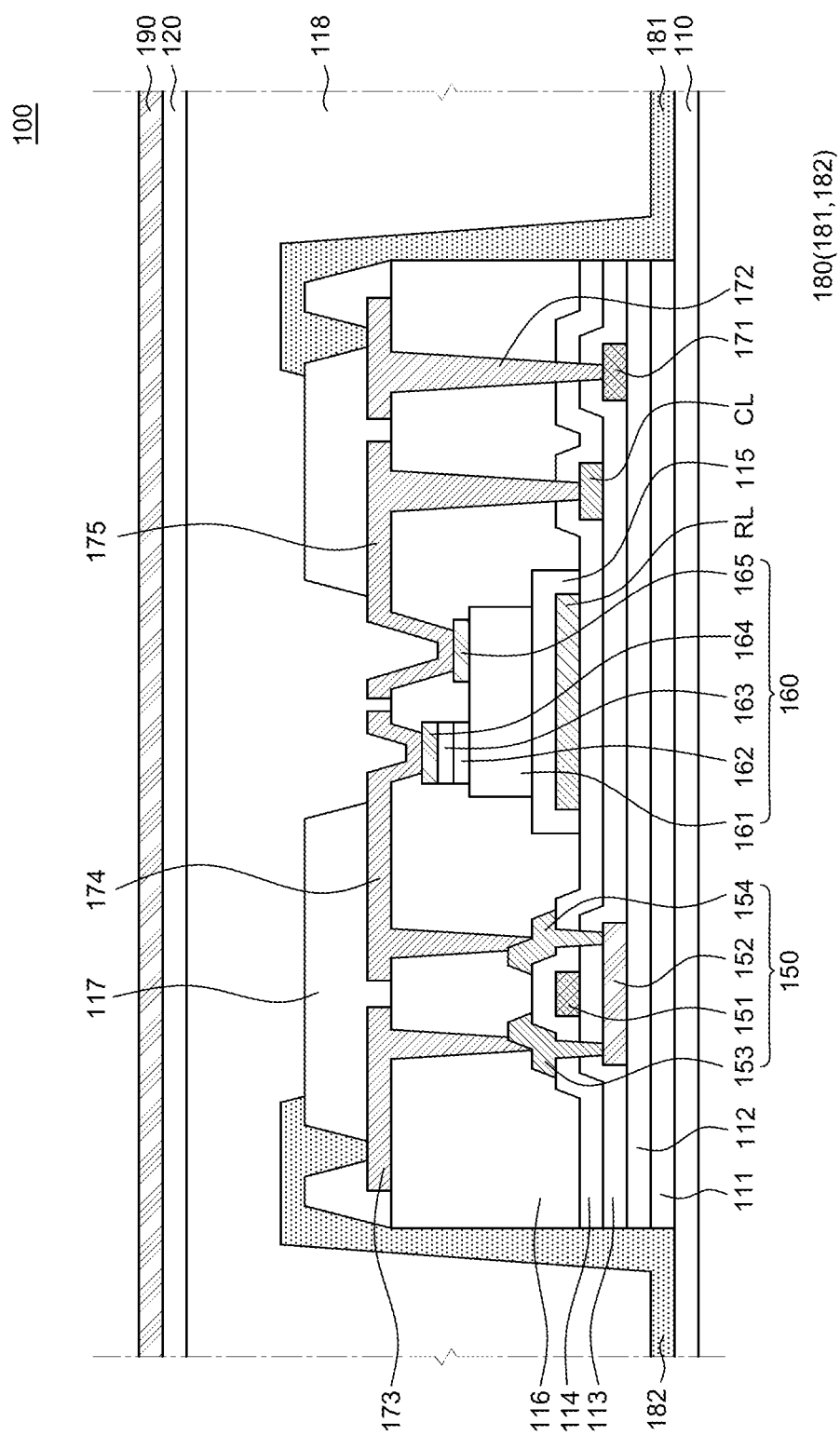
FIG. 3 is a schematic cross-sectional view showing a single sub-pixel of FIG. 1.

Referring to FIGS. 2 and 3, the plurality of island substrates 111 is disposed on the lower substrate 110. The island substrates 111 are spaced apart from one another on the lower substrate 110. For example, the island substrates 111 may be arranged in a matrix on the lower substrate 110, as shown in FIGS. 1 and 2. It is, however, to be understood that the present disclosure is not limited thereto.

Referring to FIG. 3, a buffer layer 112 is disposed on the island substrates 111. The buffer layer 112 is formed on the island substrates 111 for protecting a variety of elements of the stretchable display device 100 from moisture ($H_2O$) and oxygen ($O_2$) introduced from the outside of the lower substrate 110 and the island substrates 111. The buffer layer 112 may be made of an insulating material and may be made up of a single organic layer or multiple organic layers made of, for example, silicon nitride (SiNx), silicon oxide (SiOx), silicon oxynitride (SiON), etc. In some implementations, however, the buffer layer 112 may be eliminated depending on the structure or characteristics of the stretchable display device 100.

The buffer layer 112 may be formed only on the island substrates 111. As described above, since the buffer layer 112 may be made of an inorganic material, it may be damaged, e.g., cracks may easily occur when the stretchable display device 100 is stretched. The buffer layer 112 is not formed between the island substrates 111 but may be patterned in the shape of the island substrates 111 and formed only on the island substrates 111. Accordingly, in the stretchable display device 100 according to the exemplary aspect of the present disclosure, by forming the buffer layer 112 only on the island substrates 111 which are rigid substrates, it is possible to prevent damage to the buffer layer 112 when the stretchable display device 100 is deformed by being bent or stretched.

Referring to FIG. 3, a transistor 150 including a gate electrode 151, an active layer 152, a source electrode 153 and a drain electrode 154 is disposed on the buffer layer 112. For example, the active layer 152 is formed on the buffer layer 112, and a gate insulating layer 113 for insulating the active layer 152 from the gate electrode 151 is disposed on the active layer 152. An interlayer dielectric layer 114 for insulating the gate electrode 151 from the source electrode 153 and the drain electrode 154 is disposed. The source electrode 153 and the drain electrode 154 in contact with the active layer 152 are disposed on the interlayer dielectric layer 114.

The gate insulating layer 113 and the interlayer dielectric layer 114 may be patterned so that they are formed only on the island substrates 111. Since the gate insulating layer 113 and the interlayer dielectric layer 114 may be made of an inorganic material like the buffer layer 112, they may be easily damaged, for example, cracks may occur when the stretchable display device 100 is stretched. Accordingly, the gate insulating layer 113 and the interlayer dielectric layer 114 are not formed between the island substrates 111 but may be patterned in the shape of the island substrates 111 and formed only on the island substrates 111.

Although only a driving transistor among various transistors possibly included in the stretchable display device 100 is shown in FIG. 3 for convenience of illustration, it is to be understood that a switching transistor, a capacitor, etc. may be included in the stretchable display device. In addition, although the transistor 150 has a coplanar structure herein, other thin-film transistors having a staggered structure, for example, may also be employed.

Referring to FIG. 3, a gate pad 171 is disposed on the buffer layer 112. The gate pad 171 is a pad for transmitting a gate signal to the sub-pixels SPX. The gate pad 171 may be made of the same material as the gate electrode 151, but is not limited thereto.

Referring to FIG. 3, a common line CL is disposed on the gate insulating layer 113. The common line CL is for applying a common voltage to the sub-pixels SPX. The common line CL may be made of the same material as the source electrode 153 and the drain electrode 154 of the transistor 150, but is not limited thereto.

A reflective layer RL is disposed on the interlayer dielectric layer 114. The reflective layer RL is for reflecting the light emitted from an LED 160 toward the lower substrate 110 back to the above of the stretchable display device 100 so that the light exits. The reflective layer RL may be made of a metal material having a high reflectance.

A first adhesive layer 115 is disposed on the reflective layer RL to cover it. The first adhesive layer 115 is a layer for attaching the LED 160 on the reflective layer RL and may insulate the reflective layer RL made of a metal material from the LED 160. The first adhesive layer 115 may be made of, but is not limited to, a thermosetting material or a photocurable material. Although the first adhesive layer 115 covers only the reflective layer RL in the example shown in FIG. 3, the location of the first adhesive layer 115 is not limited thereto.

The LED 160, which is an inorganic light-emitting element, is disposed on the first adhesive layer 115 as a display element. The LED 160 is disposed such that it overlaps the reflective layer RL. The LED 160 includes an n-type layer 161, a light emitting layer 162, a p-type layer 163, an n-electrode 165 and a p-electrode 164. In the following description, it is assumed that the LED 160 has a lateral structure for convenience of illustration. It is, however, to be understood that the present disclosure is not limited thereto and the LED 160 may have a vertical structure, a flip chip structure, etc. In addition, although the LED 160, which is an inorganic light-emitting element, is employed as the display element herein, the present disclosure is not limited thereto. An organic light-emitting element can also be employed as the display element.

The n-type layer 161 of the LED 160 is disposed on the first adhesive layer 115 to overlap the reflective layer RL. The n-type layer 161 may be formed by implanting n-type impurities into gallium nitride having excellent crystallinity. The light emitting layer 162 is disposed on the n-type layer 161. The light emitting layer 162 is an emissive layer of the LED 160 that emits light and may be formed of a nitride semiconductor, for example, indium gallium nitride. The p-type layer 163 is disposed on the light emitting layer 162. The p-type layer 163 may be formed by implanting p-type impurities into gallium nitride. It is, however, to be understood that the constituent materials of the n-type layer 161, the light emitting layer 162 and the p-type layer 163 are not limited thereto.

The p-electrode 164 is disposed on the p-type layer 163 of the LED 160, and the n-electrode 165 is disposed on the n-type layer 161. The n-electrode 165 and the p-electrode 164 may be made of the same conductive material and may be made of, but is not limited to, a transparent conductive oxide.

The p-electrode 164 and the n-electrode 165 are spaced apart from each other. Specifically, the LED 160 may be fabricated by sequentially stacking the n-type layer 161, the light emitting layer 162 and the p-type layer 163, etching a predetermined portion of the light emitting layer 162 and the p-type layer 163, and forming the n-electrode 165 and the p-electrode 164. The predetermined portion is a space for separating the n-electrode 165 from the p-electrode 164. The predetermined portion may be etched out so that a part of the n-type layer 161 is exposed. In other words, the surface of the LED 160 on which the n-electrode 165 and the p-electrode 164 are disposed is not flat, and the n-electrode 165 and the p-electrode 164 may have different heights. The p-electrode 164 may be disposed on the p-type layer 163 and the n-electrode 165 may be disposed on the n-type layer 161. The p-electrode 164 and the n-electrode 165 may be spaced apart from each other at different heights. Thus, the n-electrode 165 may be disposed closer to the reflective layer RL than the p-electrode 164.

Referring to FIG. 3, a planarization layer 116 is formed over the transistor 150 and the LED 160. The planarization layer 116 provides a flat surface over the transistor 150 and the LED 160. The planarization layer 116 may be a single layer or multiple layers and may be made of organic material. For example, the planarization layer 116 may be made of, but is not limited to, an acryl based organic material.

In some exemplary aspects, a passivation layer may be formed between the transistor 150 and the planarization layer 116. That is to say, in order to protect the transistor 150 from permeation of moisture, oxygen, or the like, the passivation layer covering the transistor 150 may be formed. Before the n-electrode 165 and the p-electrode 164 which are in contact with the n-type layer 161 and the p-type layer 163 of the LED 160, respectively, are formed, a passivation layer covering the n-type layer 161, the light emitting layer 162 and the p-type layer 163 may be formed as an insulating layer for preventing an electrical short-circuit in the n-type layer 161 and the p-type layer 163. The passivation layer may be made of an inorganic material and may be made up of a single layer or multiple layers, but the present disclosure is not limited thereto.

Referring to FIG. 3, a data pad 173, a connection pad 172, a first electrode 174, and a second electrode 175 are disposed on the planarization layer 116.

The data pad 173 may transfer a data signal from the connection lines 180 serving as data lines to the sub-pixels SPX. The data pad 173 is connected to the source electrode 153 of the transistor 150 through a contact hole formed in the planarization layer 116. The data pad 173 may be formed on the interlayer dielectric layer 114 instead of the planarization layer 116 and made of the same material as the source electrode 153 and the drain electrode 154 of the transistor 150. It is, however, to be understood that the present disclosure is not limited thereto.

The connection pad 172 may transfer a gate signal from the connection lines 180 serving as gate lines to the sub-pixels SPX. The connection pad 172 is connected to the gate pad 171 through a contact hole formed in the planarization layer 116 and the interlayer dielectric layer 114 and transfers a gate signal to the gate pad 171. The connection pad 172 may be made of, but is not limited to, the same material as the data pad 173.

The first electrode 174 is an electrode that electrically connects the transistor 150 with the LED 160. The first electrode 174 is connected to the p-electrode 164 of the LED 160 through a contact hole formed in the planarization layer 116. In addition, the first electrode 174 is connected to the drain electrode 154 of the transistor 150 through a contact hole formed in the planarization layer 116. Accordingly, the p-electrode 164 of the LED 160 and the drain electrode 154 of the transistor 150 may be electrically connected to each other by the first electrode 174. It is, however, to be noted that the present disclosure is not limited thereto, and the first electrode 174 may be connected to the source electrode 153 of the transistor 150 depending on the type of the transistor 150.

The second electrode 175 is an electrode electrically connecting the LED 160 with the common line CL. The second electrode 175 is connected to the common line CL through a contact hole formed in the planarization layer 116 and is connected to the n-electrode 165 of the LED 160 through a contact hole formed in the planarization layer 116. Accordingly, the common line CL can be electrically connected to the n-electrode 165 of the LED 160.

When the stretchable display device 100 is turned on, voltages of different levels may be applied to the drain electrode 154 and the common line CL of the transistor 150, respectively. A voltage applied to the drain electrode 154 of the transistor 150 may be applied to the first electrode 174, and a common voltage from the common line CL may be applied to the second electrode 175. The voltages of different levels may be applied to the p-electrode 164 and the n-electrode 165 through the first electrode 174 and the second electrode 175, respectively, and electric current may flow to the active layer of the LED 160 so that LED can emit light.

Although the transistor 150 is electrically connected to the p-electrode 164 and the common line CL is electrically connected to the n-electrode 165 in the example shown in FIG. 3, this is merely illustrative. The transistor 150 may be electrically connected to the n-electrode 165 and the common line CL may be electrically connected to the p-electrode 164.

A bank 117 is disposed on the first electrode 174, the second electrode 175, the data pad 173, the connection pad 172 and the planarization layer 116. The bank 117 is disposed to overlap the ends of the reflective layer RL. The part of the reflective layer RL that does not overlap with the bank 117 may be defined as an emission zone. The bank 117 may include a black material in order to prevent light emitted from the LED 160 from being transmitted to an adjacent sub-pixel SPX such that the light is mixed. The bank 117 may be made of an organic insulating material and may be made of the same material as the planarization layer 116. For example, the bank 117 may be made of, but is not limited to, an acryl based resin, a benzocyclobutene (BCB) based resin, or polyimide.

The bank 117 includes a contact hole via which the connection line 180 serving as a data line is connected to the data pad 173, and a contact hole via which the connection line 180 serving as a gate line is connected to the connection pad 172.

Compared with an existing flexible organic light-emitting display device, the stretchable display device 100 according to the exemplary aspect of the present disclosure has the structure in which the relatively rigid island substrates 111 are spaced apart from one another and are arranged on the relatively flexible lower substrate 110. In addition, in the stretchable display device 100, the buffer layer 112, the gate insulating layer 113, the interlayer dielectric layer 114, the planarization layer 116, the bank 117, etc. are patterned so that they are located on each of the island substrates 111. That is to say, in the stretchable display device 100 according to the exemplary aspect of the present disclosure, the stretchable display device 100 can be more easily deformed when a user stretches or bends the stretchable display device 100. Therefore, it is possible to prevent damage to the elements of the stretchable display device 100 when the stretchable display device 100 is deformed.

The stretchable display device 100 according to the exemplary aspect of the present disclosure includes the LED 160. The LED 160 is made of an inorganic material instead of an organic material, and therefore has excellent reliability and a longer lifetime than a liquid-crystal diode or an organic light-emitting diode. In addition, the LED 160 can be turned on and off quickly, consume less power, are robust to impact, are stable, and can exhibit high luminous efficiency to display a high-brightness image. Accordingly, the LED 160 is advantageous for large screens. In particular, since the LED 160 is made of an inorganic material instead of an organic material, a sealing layer required for an organic light-emitting element may not be used. Therefore, in the stretchable display device 100 according to the exemplary aspect of the present disclosure, by employing the LED 160 as the display element, it is possible to eliminate a sealing layer that may be easily damaged when the stretchable display device 100 is deformed, i.e., bent or stretched. In addition, since the LED 160 is made of an inorganic material instead of an organic material, the display element of the stretchable display device 100 according to the exemplary aspect of the present disclosure can be protected from moisture or oxygen, achieving high reliability.

The connection lines 180 refer to lines for electrically connecting between the pads on the island substrates 111. The connection lines 180 include first connection lines 181 and second connection lines 182. The first connection lines 181 are extended in the x-axis direction, and the second connection lines 182 are extended in the y-axis direction.

For a typical display device, a variety of lines such as gate lines and data lines are extended between the sub-pixels. A plurality of sub-pixels is connected to a single signal line. Accordingly, in a type display device, the lines such as the gate lines, the data lines, the high-voltage supply line, the reference voltage line and the common line are seamlessly extended from one side to the other side of the display device on the substrate.

In contrast, for the stretchable display device 100 according to the exemplary aspect of the present disclosure, a variety of lines made of a metal, such as the gate line, the data line, the high-voltage supply line, the reference voltage line and the common line are disposed only on the island substrates 111. That is to say, in the stretchable display device 100 according to the exemplary aspect of the present disclosure, a variety of lines made of a metal are disposed only on the island substrates 111 but not in contact with the lower substrate 110. Accordingly, the variety of lines may be patterned such that they are disposed only on the island substrates 111 and extended discontinuously.

In the stretchable display device 100 according to the exemplary aspect of the present disclosure, the pads on every two adjacent ones of the islands substrates 111 may be connected by the connection lines 180 in order to connect the discontinuous lines with one another. That is to say, the connection lines 180 electrically connect the pads on the two adjacent island substrates 111. Accordingly, the stretchable display device 100 according to the exemplary aspect of the present disclosure may include the plurality of connection lines 180 so that a variety of lines such as the gate line, the data line, the high-voltage supply line, the reference voltage line and the common line are electrically connected to one another between the island substrates 111. For example, a gate line may be disposed on the island substrates 111 disposed adjacent to each other in the x-axis direction, and gate pads 171 may be disposed at both ends of the gate line. The gate pads 171 on the island substrates 111 disposed adjacent to each other in the x-axis direction may be connected to each other by a connection line 180 serving as the gate line. Accordingly, the gate line disposed on the island substrates 111 and the connection line 180 disposed on the light substrate 110 may serve as a single gate line. In addition, each of the lines that can be included in the stretchable display device 100 such as the data lines, the high-voltage supply line, the reference voltage line and the common lines may also serve as a single line by the connection lines 180.

Referring to FIG. 2, the first connection lines 181 can connect the pads on every two adjacent ones of the island substrates 111 that are arranged in parallel in the x-axis direction. The first connection lines 181 may serve as, but is not limited to, the gate lines, etc. For example, the first connection lines 181 may serve as the gate lines and can electrically connect between the gate pads 171 on the two island substrates 111 adjacent each other in the x-axis direction. Accordingly, as described above, the gate pads 171 on the island substrates 111 disposed adjacent to each other in the x-axis direction may be connected to each other by the first connection lines 181 serving as the gate lines, such that a single gate signal may be transmitted.

Referring to FIG. 2, the second connection lines 182 can connect the pads on every two adjacent ones of the island substrates 111 that are arranged in parallel in the y-axis direction. The second connection lines 182 may serve as, but is not limited to, the data lines, etc. For example, the second connection lines 182 may serve as the data lines and can electrically connect between the data pads 173 on the two island substrates 111 adjacent each other in the y-axis direction. Accordingly, as described above, the data pads 173 on the island substrates 111 disposed adjacent to each other in the y-axis direction may be connected to each other by the second connection lines 182 serving as the data lines, such that a single data signal may be transmitted.

Referring to FIG. 2, the connection lines 180 include a base polymer and conductive particles. Specifically, the first connection lines 181 include a base polymer and conductive particles, and the second connection lines 182 include a base polymer and conductive particles.

The first connection lines 181 may be in contact with the upper surface and the side surface of the bank 117, the side surfaces of the planarization layer 116, the interlayer dielectric layer 114, the gate insulating layer 113 and the buffer layer 112 disposed on the island substrate 111, and the side surface of the island substrate 111, and may be extended to the upper surface of the lower substrate 110. Accordingly, the first connection lines 181 may be in contact with the upper surface of the lower substrate 110, the side surface of an adjacent island substrate 111, the side surfaces of the buffer layer 112, the gate insulating layer 113, the interlayer dielectric layer 114, the planarization layer 116 and the bank 117 disposed on the adjacent island substrate 111. The first connection lines 181 may be, but is not limited to being, in contact with the connection pad 172 disposed on the adjacent island substrate 111.

The base polymer of the first connection lines 181 may be made of an insulating material which may be bent or stretched similarly to the lower substrate 110. The base polymer may include, but is not limited to, a silicone rubber such as polydimethylsiloxane (PDMS), an elastomer such as polyurethane (PU), styrene butadiene styrene (SBS), etc. Thus, when the stretchable display device 100 is bent or stretched, it is possible to prevent the base polymer from being damaged. The base polymer may be formed by coating a material for the base polymer or applying it using a slit onto the lower substrate 110 and the island substrate 111.

The conductive particles of the first connection lines 181 may be dispersed in the base polymer. Specifically, the first connection lines 181 may include conductive particles dispersed in the base polymer at the same constant concentration. The first connection lines 181 may be formed by, for example, uniformly stirring the conductive particles in the base polymer, and then coating the base polymer in which the conductive particles are dispersed onto the lower substrate 110 and the island substrates 111 to harden it. It is, however, to be understood that the present disclosure is not limited thereto. The conductive particles may include, but is not limited to, at least one of silver (Ag), gold (Au) and carbon (carbon).

The conductive particles dispersed in the base polymer of the first connection lines 181 may form a conductive path for electrically connecting the connection pads 172 disposed on the adjacent island substrates 111 with each other. In addition, a conductive path may be formed by electrically connecting the gate pad 171 formed on the outermost one of the island substrates 111 with the pads disposed in the non-active area NA.

Referring to FIG. 2, the base polymer of the first connection lines 181 and the conductive particles dispersed in the base polymer may linearly connect between the pads disposed on the island substrate 111 adjacent to each other. To this end, the base polymer may be formed in a straight line shape that connects between the pads disposed on the island substrates 111 during the fabricating process. Thus, the conductive path formed by the conductive particles dispersed in the base polymer may also be in a straight line shape. However, the fabricating process and shape of the base polymer and the conductive particles of the first connection lines 181 may not be limited thereto.

Referring to FIG. 2, the second connection lines 182 may be in contact with the upper surface and the side surface of the bank 117, the side surfaces of the planarization layer 116, the interlayer dielectric layer 114, the gate insulating layer 113 and the buffer layer 112 disposed on the island substrate 111, and the side surface of the island substrate 111, and may be extended to the upper surface of the lower substrate 110. Accordingly, the second connection lines 182 may be in contact with the upper surface of the lower substrate 110, the side surface of an adjacent island substrate 111, the side surfaces of the buffer layer 112, the gate insulating layer 113, the interlayer dielectric layer 114, the planarization layer 116 and the bank 117 disposed on the adjacent island substrate 111. The second connection lines 182 may be, but is not limited to being, in contact with the data pad 173 disposed on the adjacent island substrate 111.

The base polymer of the second connection lines 182 may be made of an insulating material which may be bent or stretched similarly to the lower substrate 110. The base polymer of the second connection lines 182 may be the same material as that of the first connection lines 181. The base polymer may include, but is not limited to, a silicone rubber such as polydimethylsiloxane (PDMS), an elastomer such as polyurethane (PU), styrene butadiene styrene (SBS), etc.

The conductive particles of the second connection lines 182 may be dispersed in the base polymer. Specifically, the second connection line 182 may include conductive particles dispersed in the base polymer at the same constant concentration. The concentration of the conductive particles dispersed at the upper portion of the base polymer of the second connection lines 182 may be substantially equal to the concentration of the conductive particles dispersed at the lower portion of the base polymer thereof. In addition, the process of fabricating the second connection lines 182 may be the same as the process of fabricating the first connection lines 181, or may be carried out simultaneously.

The conductive particles dispersed in the base polymer of the second connection lines 182 may form a conductive path for electrically connecting between the data pads 173 disposed on the adjacent island substrates 111. In addition, a conductive path may be formed by electrically connecting the data pad 173 formed on the outermost one of the island substrates 111 with the pads disposed in the non-active area NA.

Referring to FIG. 2, the base polymer of the second connection lines 182 and the conductive particles dispersed in the base polymer may linearly connect between the pads disposed on the island substrate 111 adjacent to each other. To this end, the base polymer may be formed in a straight line shape that connects between the pads disposed on the island substrates 111 during the fabricating process. Thus, the conductive path formed by the conductive particles dispersed in the base polymer may also be in a straight line shape. However, the fabricating process and shape of the base polymer and the conductive particles of the second connection lines 182 may not be limited thereto.

Referring back to FIG. 3, an upper substrate 120, a polarization layer 190 and a second adhesive layer 118 are disposed on the lower substrate 110.

The upper substrate 120 supports a variety of elements disposed thereunder. The upper substrate 120 may be made of an insulating material that can be bent or stretched as a flexible substrate. The upper substrate 120 may be a flexible substrate and may be reversibly expanded and contracted. In addition, the elastic modulus may be several MPa to several hundred MPa, and the elongation ratio may be 100% or higher. The thickness of the upper substrate 120 may be, but is not limited to, 10 μm to 1 mm.

The upper substrate 120 may be made of the same material as the lower substrate 110. For example, the upper substrate 120 may be made of an elastomer such as polyurethane (PU) and a silicone rubber such as polydimethylsiloxane (PDMS) accordingly can have flexibility. It is, however, to be understood that the material of the upper substrate 120 is not limited thereto.

By pressing the upper substrate 120 against the lower substrate 110, the upper substrate 120 and the lower substrate 110 can be attached together by the second adhesive layer 118 disposed between the upper substrate 120 and the lower substrate 110. It is, however, to be understood that the present disclosure is not limited thereto. In some implementations, the second adhesive layer 118 may be eliminated.

The polarizing layer 190 is disposed on the upper substrate 120. The polarizing layer 190 can polarize light incident from the outside of the stretchable display device 100. The polarized light that has passed through the polarizing layer 190 and is incident into the stretchable display device 100 may be reflected inside the stretchable display device 100 and the phase may be shifted accordingly. As the phase of the light is shifted, the light may not pass through the polarization layer 190. As a result, the light incident from the outside of the stretchable display device 100 into the inside of the stretchable display device 100 cannot exit to the outside of the stretchable display device 100, and thus the reflection of the external light can be reduced.

Since the stretchable display device has to be easily bent or stretched, there has been an attempt to use a flexible substrate having a small modulus. However, when a flexible material having a small modulus such as polydimethylsiloxane (PDMS) is used as the lower substrate, such a material is vulnerable to heat. Therefore, there is a problem that the substrate is damaged by a high temperature, for example, a temperature of 100 C or more generated during the process of forming the transistors and the display elements.

In view of the above, it is necessary to form display elements on the substrate made of a material which can withstand a high temperature in order to prevent the substrate from being damaged during the process of forming the display elements. Accordingly, there has been an attempt to form the substrate with a material such as polyimide (PI) that can withstand a high temperature during the fabricating process. However, the materials which can withstand a high temperature have a high modulus and do not have flexibility. Accordingly, there is a problem that the substrate is not easily bent or stretched when the stretchable display device is stretched.

In view of the above, in the stretchable display device 100 according to the exemplary aspect of the present disclosure, the rigid island substrates 111 are disposed only in regions where the transistors 150 and the like are disposed, so that the island substrates 111 are not damaged by a high temperature during the process of fabricating the transistors 150 and the like.

In addition, in the stretchable display device 100 according to the exemplary aspect of the present disclosure, the flexible lower substrate 110 and the flexible upper substrate 120 may be disposed under and above the island substrates 111, respectively. Therefore, the parts of the lower substrate 110 and the upper substrate 120 that do not overlap with the island substrates 111 can be easily stretched or bent, so that the stretchable display device 100 can be implemented. In addition, since the transistors 150, the LEDs 160 and the like are disposed on the rigid island substrates 111, it is possible to prevent them from being damaged when the stretchable display device 100 is bent or stretched.

When a stretchable display device is bent or stretched, only the flexible lower substrate may be deformed but the rigid island substrates may not be deformed. If the lines that connect between the pads disposed on the island substrates are not made of a material that easily bends or stretches, the lines may be damaged due to cracks or the like as the lower substrate is deformed.

In contrast, in the stretchable display device 100 according to the exemplary aspect of the present disclosure, the pads disposed on the island substrates 111 may be electrically connected with one another by the connection lines 180 containing the base polymer and the conductive particles. The base polymer has flexibility and thus can be easily deformed. Accordingly, in the stretchable display device 100 according to the exemplary aspect of the present disclosure, the connection lines 180 including the base polymer can be easily deformed between the island substrate 111 and the island substrate 111 as the stretchable display device 100 is deformed, i.e., bent or stretched.

In addition, in the stretchable display device 100 according to the exemplary aspect of the present disclosure, since the connection lines 180 include the conductive particles, a damage such as a crack do not occur in the conductive path made of the conductive particles even if the base polymer is deformed. For example, when the stretchable display device 100 is deformed, i.e., bent or stretched, the portions of the flexible lower substrate 110 that do not overlap with the rigid island substrates 111 may be deformed. When this happens, the distance between the conductive particles disposed on the deformed lower substrate 110 may be changed. However, the concentration of the conductive particles disposed at the upper portion of the base polymer to form the conductive path can be kept high so that an electrical signal can be transmitted even if the distance between the conductive particles is increased. Accordingly, even if the base polymer is bent or stretched, the conductive path by the conductive particles can efficiently transmit electric signals. That is to say, electric signals may be transmitted between the pads even when the stretchable display device 100 is deformed, i.e., bent or stretched.

In the stretchable display device 100 according to the exemplary aspect of the present disclosure, the connection lines 180 for connecting between the pads disposed on the adjacent island substrates 111 include the base polymer and the conductive particles, such that they may be arranged by the shortest distance, i.e., in a straight line shape. That is to say, even if the connection lines 180 are not formed in a curved shape, the stretchable display device 100 can be implemented. The conductive particles of the connection lines 180 are dispersed in the base polymer to form a conductive path. As the stretchable display device 100 is deformed, i.e., bent or stretched, the conductive path by the conductive particles may be bent or stretched. When this happens, the distance between the conductive particles is changed, but the conductive path formed by the conductive particles can still transmit an electrical signal. Thus, in the stretchable display device 100 according to the exemplary aspect of the present disclosure, it is possible to save the space occupied by the connection lines 180.

Although the connection lines 180 are made of the base polymer and the conductive particles dispersed in the base polymer in the example shown in FIGS. 1 to 3, the present disclosure is not limited thereto. The connection lines 180 may be made of a metal material. The connection lines 180 may be formed of the same material as a variety of elements disposed on the island substrates 111 via the same process, such as the gate electrode 151, the source electrode 153 and the drain electrode 154 of the transistor 150, and the common line CL. The connection lines 180 may be disposed in a curved shape when viewed from the top, so that they can be easily stretched when the stretchable display device 100 is stretched. The connection lines 180 may be in direct contact with the lower substrate 110 or a substrate extended from the island substrate 111 may be disposed between the connection lines 180 and the lower substrate 110.

Figure 4:
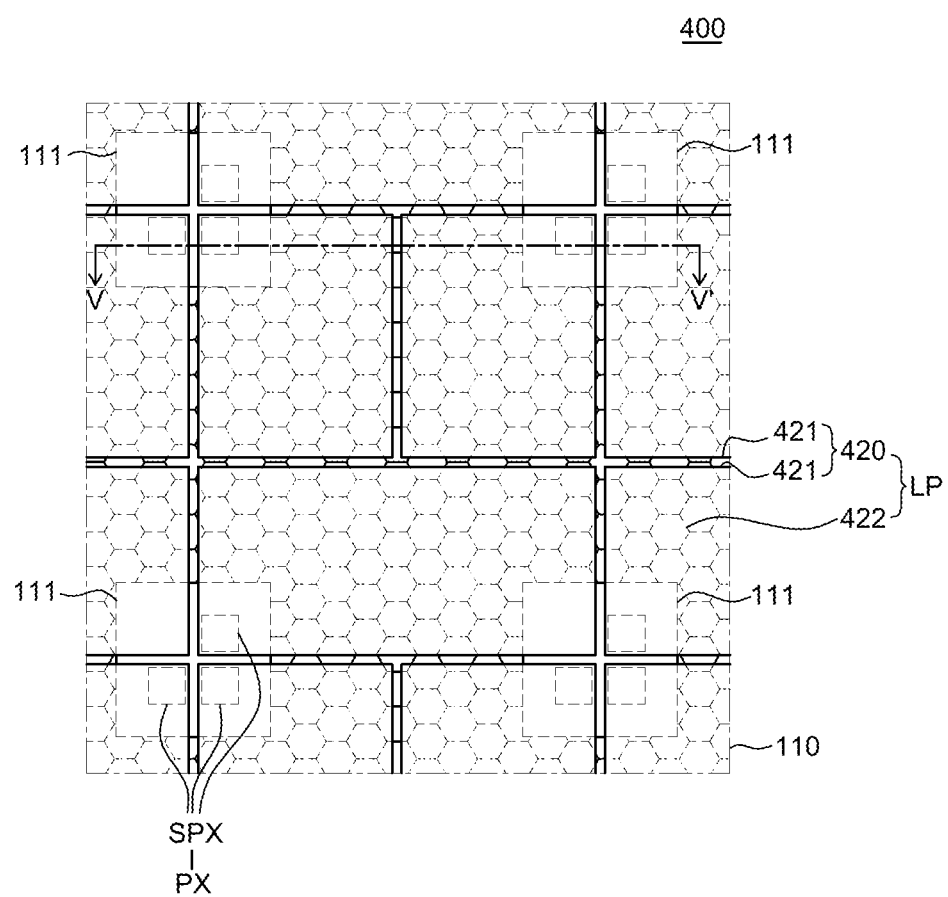
FIG. 4 is an enlarged plan view of a stretchable display device according to another exemplary aspect of the present disclosure.
Figure 5:
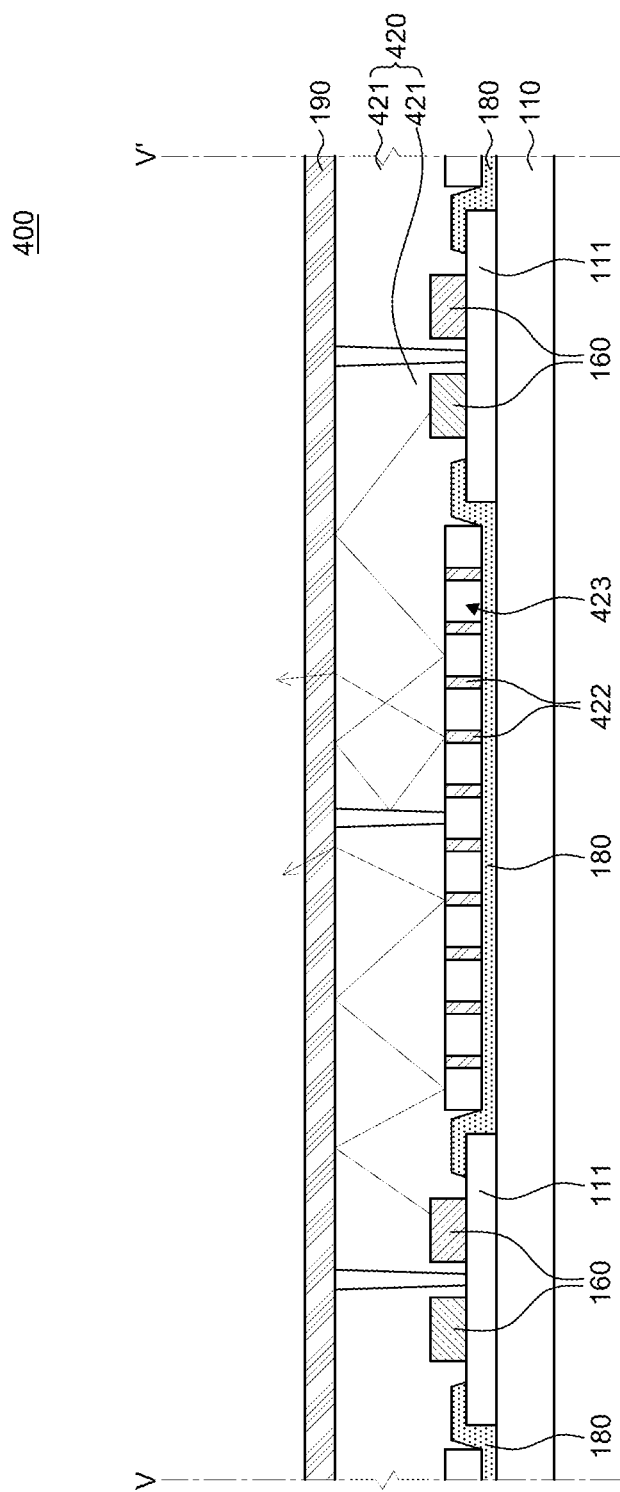
FIG. 5 is a schematic cross-sectional view taken along line V-V' of FIG. 4.

FIG. 4 is an enlarged plan view of a stretchable display device according to another exemplary aspect of the present disclosure. FIG. 5 is a schematic cross-sectional view taken along line V-V' of FIG. 4. A stretchable display device 400 according to the exemplary aspect shown in FIGS. 4 and 5 is substantially identical to the stretchable display device 100 shown in FIGS. 1 to 3 except that the former further includes a light-transmitting unit LP; and, therefore, the redundant description will be omitted. For convenience of illustration, FIG. 4 shows only a lower substrate 110, a plurality of island substrates 111, a plurality of sub-pixels SP and a light-transmitting unit LP. In addition, FIG. 5 shows only a plurality of LEDs 160 disposed in a plurality of sub-pixels SPX, respectively, among the elements on the island substrate 111 for convenience of illustration.

Referring to FIGS. 4 and 5, the light-transmitting unit LP is disposed on the lower substrate 110 and the island substrates 111. The light-transmitting unit LP includes partition walls 422 and a light-transmitting layer 420 to transmit light from the LEDs 160.

The partition walls 422 are disposed on the lower substrate 110 and the connection lines 180. Specifically, the partition walls 422 are disposed on the lower substrate 110 and the connection lines 180 between the island substrates 111. The partition walls 422 can transmit light emitted from the LEDs 160 disposed on the island substrates 111 to a region between the island substrates 111. Specifically, the partition walls 422 transmit light directed to the side surfaces of the LEDs 160 among the light emitted from the LEDs 160 to a region between the island substrates 111 so that light can exit even in the region between the island substrates 111.

The partition walls 422 may be extended in a direction perpendicular to the upper surface of the lower substrate 110 and the connection lines 180. The partition walls 422 may be formed in a mesh shape when viewed from the top. The mesh-shaped partition walls 422 expose a part of the upper surface of the connection lines 180 and a part of the upper surface of the lower substrate 110. It is to be noted that the shape of the partition walls 422 when viewed from the top is not limited thereto.

The modulus of the partition walls 422 is smaller than the modulus of the island substrates 111 and may be less than or equal to the modulus of the lower substrate 110. The partition walls 422 may be made of a material having elasticity so that the partition walls 422 can be deformed together with the lower substrate 110 and the connection lines 180 when the stretchable display device 400 is stretched. For example, the partition walls 422 may be made of, but is not limited to, a material having elasticity such as silicon and urethane.

Referring to FIGS. 4 and 5, the light-transmitting layer 420 is disposed on the island substrates 111 and the partition walls 422. Thus, the light-transmitting layer 420 may serve as an upper substrate. The light-transmitting layer 420 includes a plurality of sub-light-transmitting layers 421 spaced apart from one another. Specifically, the light-transmitting layer 420 may include a plurality of sub-light-transmitting layers 421 patterned conforming to the LEDs 160, respectively.

Each of the sub-light-transmitting layers 421 may overlap with one of the LEDs 160 and some of the partition walls 422. Light emitted from the LEDs 160 may be induced to the sub-light-transmitting layers 421, respectively. The sub-light-transmitting layers 421 may be disposed to overlap a plurality of sub-pixels SPX emitting light of different colors, respectively. Each of the sub-light-transmitting layers 421 may be disposed to overlap with a part of one of the rigid regions and with a portion of the flexible region. More specifically, each of the plurality of sub-light-transmitting layers 421 may be disposed to overlap one of the island substrates 111 on which the LEDs 160 are disposed, respectively, and the partition walls 422 disposed adjacent to the respective island substrates 111. Accordingly, the sub-light-transmitting layers 421 may be disposed to overlap a portion of the rigid regions of the lower substrate 110 overlapping with the island substrates 111 and a portion of the flexible region of the lower substrate 110 not overlapping with the island substrates 111. The light emitted from one LED 160 may be transmitted to one sub-light-transmitting layer 421 of the entirety of the sub-light-transmitting layers 421 that overlaps with the LED 160. Accordingly, a region corresponding to a single sub-light-transmitting layer 421 can serve as a single emission zone.

As the sub-light-transmitting layers 421 are spaced apart from one another, light emitted from an LED 160 can be transmitted only within the respective sub-light-transmitting layer 421 and is not transmitted to another sub-light-transmitting layer 421 spaced apart from it. Specifically, since the sub-light-transmitting layers 421 are spaced apart from one another, and a gas having a lower refractive index than that of the sub-light-transmitting layers 421 is located between the sub-light-transmitting layers 421, light is not transmitted from a sub-light-transmitting layer 421 to an adjacent sub-light-transmitting layer 421. In this manner, it is possible to suppress color mixture of light emitted from the LEDs 160 by virtue of the sub-light-transmitting layers 421 spaced apart from one another.

Referring to FIGS. 4 and 5, the partition walls 422, the light-transmitting layer 420, the lower substrate 110 and the connection lines 180 may form voids 423. Specifically, the upper side of the voids 423 may be defined by the light-transmitting layer 420, the left and right sides of the voids 423 may be defined by the partition walls 422 or the light-transmitting layer 420, and the lower side of the voids 423 may be defined by the lower substrate 110 or the connection lines 180. Each of the voids 423 may be an empty space filled with air.

As the partition walls 422 have the voids 423 filled with air, the light emitted from the LEDs 160 can be guided to the region between the island substrate 111 and the island substrate 111, i.e., the entirety of the light-transmitting layer 420 based on the principle of total reflection. For example, when the light-transmitting layer 420 is made of polydimethylsiloxane (PDMS), the light-transmitting layer 420 has the refractive index of approximately 1.4. When the partition walls 422 are made of silicon or urethane, the partition walls 422 have a refractive index of approximately 1.4 to 1.6. The air in the voids 423 may have the refractive index of 1. The light emitted from the LEDs 160 can be directed to the light-transmitting layer 420. The light toward the voids 423 is reflected over and over in the light-transmitting layer 420 by the total reflection, and may be transmitted in the light-transmitting layer 420. Specifically, the total reflection is a phenomenon that light that is directed from a material having a higher refractive index to a material having a lower refractive index does not pass through the interface between the two materials and is reflected when the incident angle is larger than the critical angle. That is to say, when light is incident on the air having a lower refractive index from the light-transmitting layer 420 having a higher refractive index, a part of the light that has at an incident angle larger than the critical angle is reflected off the boundary between the light-transmitting layer 420 and the voids 423 back to the inside of the light-transmitting layer 420, such that it may be transmitted to the front surface of the light-transmitting layer 420. On the other hand, light traveling from the light-transmitting layer 420 having a lower refractive index to the partition walls 422 having a higher refractive index is not totally reflected but is refracted at the interface between the light-transmitting layer 420 and the partition walls 422, such that it is reflected at a different angle from the incident angle. Accordingly, the light refracted at the interface between the light-transmitting layer 420 and the partition walls 422 may exit to the outside through the upper surface of the light-transmitting layer 420.

Therefore, to transmit the light emitted from the LEDs 160 into the sub-light-transmitting layer 421 so that the light exits upward from the sub-light-transmitting layer 421, the refractive index of the sub-light-transmitting layer 421 may be smaller than or equal to the refractive index of the partition walls 422.

In the stretchable display device 400 according to the exemplary aspect of the present disclosure, the light-transmitting unit LP is disposed so that the light emitted from the LEDs 160 is transmitted to the regions between the island substrates 111, thereby achieving uniform luminance throughout the surface of the stretchable display device 400. When the stretchable display device 400 is stretched, the distance between the island substrates 111 can be increased and the distance between the LEDs 160 can also be increased. As the distance between the LEDs 160 is increased, the luminance may decrease in the regions between the island substrates 111 where the display elements are not disposed. Since the regions between the island substrates 111 are easily deformed by an external force, it is difficult to compensate for a decrease in luminance by providing a separate display element for emitting light. In addition, Mura such as a lattice pattern may be perceived by a viewer in the regions.

In this regard, in the stretchable display device 400 according to the exemplary aspect of the present disclosure, a light-transmitting unit LP for transmitting light to the regions between the island substrates 111 is disposed, so that a decrease in luminance in the regions between the island substrates 111 can be compensated for. Specifically, the light-transmitting unit LP includes the partition walls 422 disposed between the island substrates 111 and including the voids 423, and the light-transmitting layer 420 disposed on the LEDs 160 and the partition walls 422. The light emitted from the LEDs 160 may be totally reflected by the air in the voids 423 to be transmitted to the entire sub-light-transmitting layer 421, and may exit toward the above of the sub-light-transmitting layer 421 by the partition walls 422. Since the sub-light-transmitting layers 421 are spaced apart from one another, lights emitted from the LEDs 160 do not mix, so that the light emitted from one LED 160 can be transmitted to each of the sub-light-transmitting layers 421. As a result, light can be transmitted to the entirety of the sub-light-transmitting layers 421 overlapping the regions between the island substrates 111, and light can be perceived as if it is emitted even in the regions between the island substrates 111. Thus, even when the distance between the island substrates 111 is increased as the stretchable display device 400 is stretched, light emitted from the LEDs 160 is transmitted through the partition walls 422 and the sub-light-transmitting layers 421 to be uniformly transmitted to the front surface of the stretchable display device 400, and thus the uniformity of the luminance can be improved through the surface of the stretchable display device 400. Accordingly, in the stretchable display device 400 according to the exemplary aspect of the present disclosure, the partition walls 422 having the voids 423 and the light-transmitting layer 420 are disposed, so that the light emitted from the LEDs 160 on the island substrates 111 can be transmitted to the regions between the island substrates 111, thereby improving luminance uniformity and avoiding mura such as a lattice pattern when the stretchable display device 400 is stretched.

Figure 6:
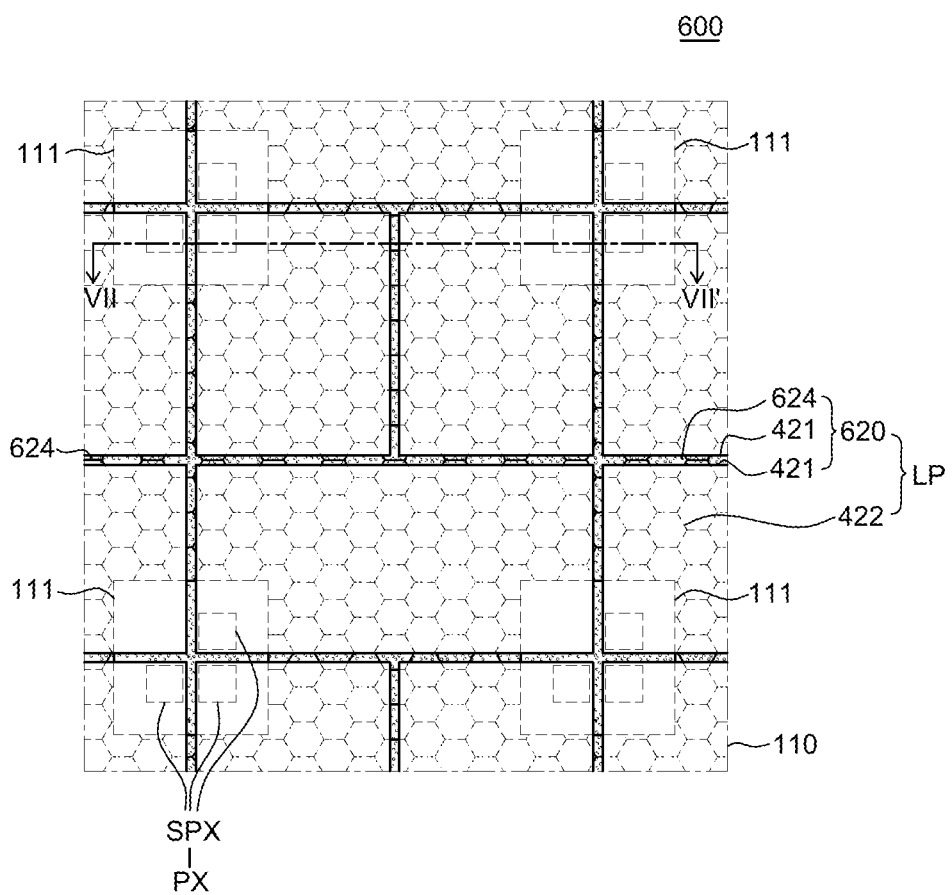
FIG. 6 is an enlarged plan view of a stretchable display device according to yet another exemplary aspect of the present disclosure.
Figure 7:
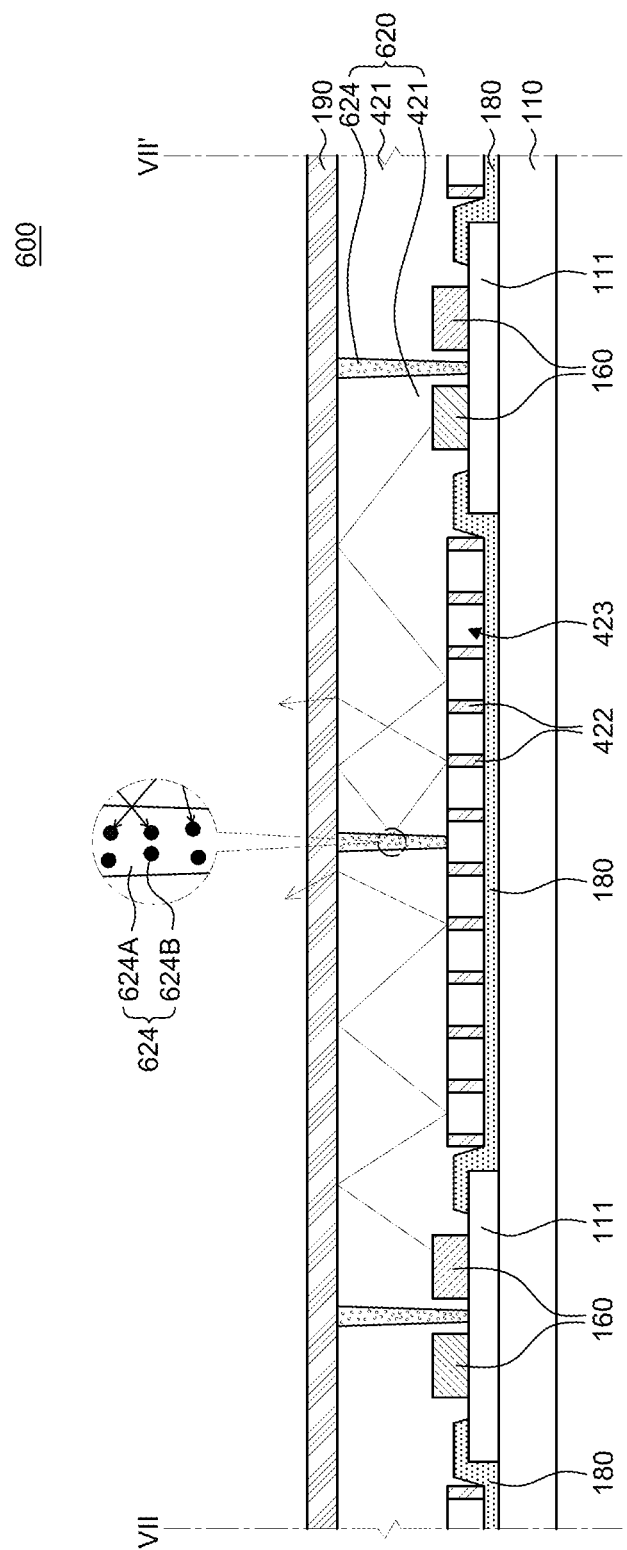
FIG. 7 is a schematic cross-sectional view taken along line VII-VII' of FIG. 6.

FIG. 6 is an enlarged plan view of a stretchable display device according to yet another exemplary aspect of the present disclosure. FIG. 7 is a schematic cross-sectional view taken along line VII-VII' of FIG. 6. A stretchable display device 600 according to the exemplary aspect shown in FIGS. 6 and 7 is substantially identical to the stretchable display device 400 shown in FIGS. 4 to 5 except that a light-transmitting layer 620 further includes blocking units 624; and, therefore, the redundant description will be omitted.

Referring to FIGS. 6 and 7, the light-transmitting layer 620 of the light-transmitting unit LP further includes the blocking units 624 disposed between the sub-light-transmitting layers 421. The blocking units 624 are disposed between the sub-light-transmitting layers 421 through which light emitted from the LEDs 160 is transmitted and is in contact with the sub-light-transmitting layers 421 in order to prevent the light transmitted to each of the sub-light-transmitting layers 421 from being transmitted to adjacent one, i.e., the color mixture.

Each of the sub-light-transmitting layers 421 disposed in the respective LEDs 160 may serve as a single emission zone, as described above. Accordingly, the blocking units 624 disposed between the sub-light-transmitting layers 421 may be defined as being disposed between emission zones from which light emitted from each of the LEDs 160 exits.

Each of the blocking unit 624 includes a base resin 624A having the same refractive index as the light-transmitting layer 620 and a plurality of dyes 624B dispersed in the base resin 624A. The dyes 624B can absorb some of the light transmitted in the sub-light-transmitting layers 421 which travel toward another sub-light-transmitting layer 421, to prevent color mixture. That is to say, as shown in FIG. 7, the light incident on the blocking units 624 may be incident on the dyes 624B of the blocking units 624 and accordingly absorbed by the blocking units 624. Accordingly, the light transmitted in one sub-light-transmitting layer 421 may not be transmitted to an adjacent sub-light-transmitting layer 421.

In the stretchable display device 600 according to the exemplary aspect of the present disclosure, the blocking units 624 are disposed between the sub-light-transmitting layers 421, thereby suppressing color mixture. The blocking units 624 include the base resin 624A and the dyes 624B dispersed in the base resin 624A. The blocking units 624 can absorb light directed to an adjacent sub-light-transmitting layer 421 of the light transmitted in the sub-light-transmitting layers 421, to prevent color mixture. Accordingly, in the stretchable display device 600 according to the exemplary aspect of the present disclosure, the blocking units 624 are disposed between the sub-light-transmitting layers 421, so that light of only one color can be transmitted in and exit from each of the sub-light-transmitting layers 421, thereby suppressing the color mixture of light.

Figure 8:
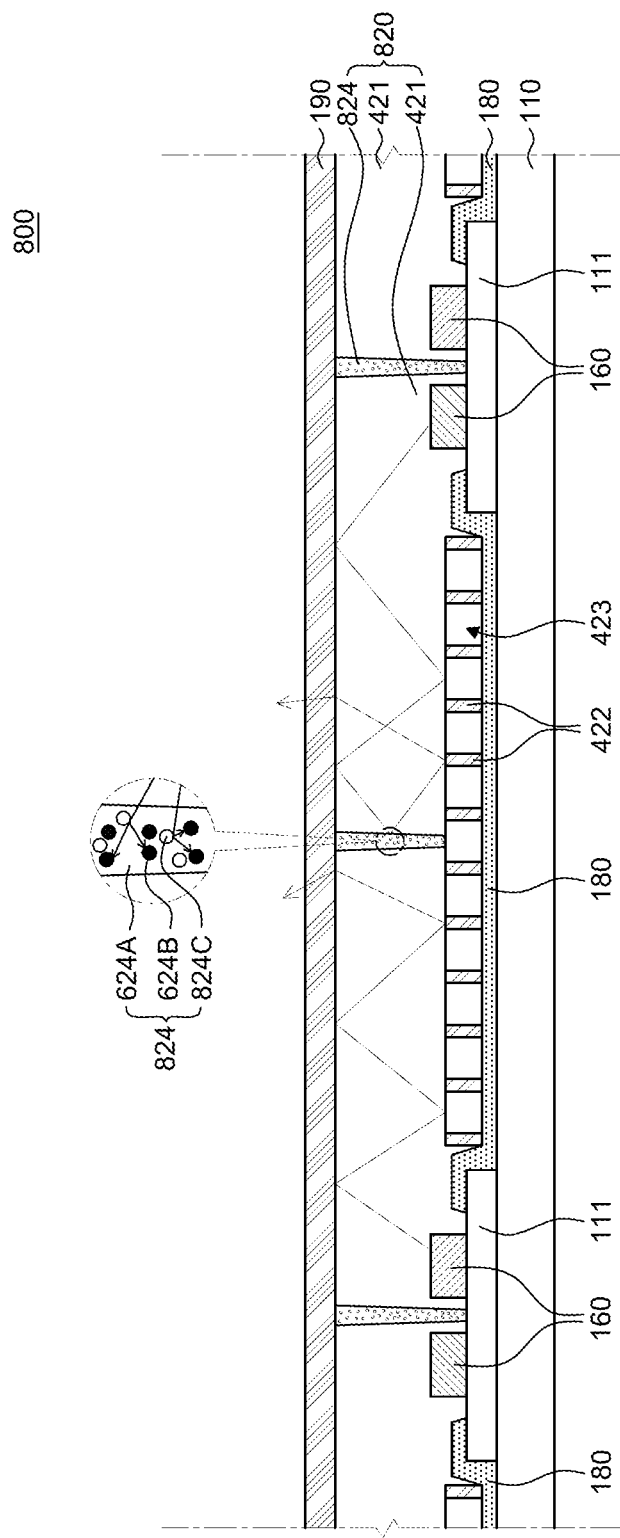
FIG. 8 is a schematic cross-sectional view of a stretchable display device according to yet another exemplary aspect of the present disclosure.

FIG. 8 is a schematic cross-sectional view of a stretchable display device according to yet another exemplary aspect of the present disclosure. A stretchable display device 800 according to the exemplary aspect shown in FIG. 8 is substantially identical to the stretchable display device 600 shown in FIGS. 6 and 7 except that blocking units 824 of a light-transmitting layer 820 further contain scattering particles 824C; and, therefore, the redundant description will be omitted.

Referring to FIG. 8, the blocking units 824 of the light-transmitting layer 820 of the light-transmitting unit LP include a base resin 624A having the same refractive index as the sub-light-transmitting layer 421, a plurality of dyes 624B dispersed in the base resin 624A, and a plurality of scattering particles 824C having a different refractive index from that of the base resin 624A and dispersed in the base resin 624A. As described above, the dyes 624B can absorb some of the light transmitted in the sub-light-transmitting layers 421 which travel toward another sub-light-transmitting layer 421, to prevent color mixture. That is to say, as shown in FIG. 8, the light incident on the blocking units 824 may be incident on the dyes 624B of the blocking units 824 and accordingly absorbed by the blocking units 824. Accordingly, the light transmitted in one sub-light transmitting layer 421 may not be transmitted to an adjacent sub-light transmitting layer 421.

However, if the density of the dyes 624B in the blocking units 824 is low, some of the light incident on the blocking units 824 may not be absorbed but may pass through the space between the dyes 624B to be transmitted to an adjacent sub-light-transmitting layer 421. In addition, even if the density of the dyes 624B in the blocking units 824 is sufficiently high, when the stretchable display device 800 is stretched, the distance between the dyes 624B is increased such that some of the light incident on the blocking units 824 may not be absorbed by the dyes 624B but may pass through the space between the dyes 624B to be transmitted to an adjacent sub-light-transmitting layer 421.

In this regard, the blocking units 824 according to another exemplary aspect may further include a plurality of scattering particles 824C dispersed in the base resin 624A in addition to the plurality of dyes 624B. The scattering particles 824C can change the light path by scattering light that can pass between the dyes 624B so that the scattered light can be directed toward the dyes 624B. Thus, the dyes 624B can additionally absorb the light scattered by the scattering particles 824C. The scattering particles 824C may be, but is not limited to, hollow beads. The scattering particles 824C may be made of any material as long as it has a refractive index different from that of the base resin 624A and can scatter incident light.

In the stretchable display device 800 according to the exemplary aspect of the present disclosure, the blocking units 824 are disposed between the sub-light transmitting layers 421, thereby suppressing color mixture. The blocking units 824 include the base resin 624A, the plurality of dyes 624B, and the plurality of scattering particles 824C. As the dyes 624B and the scattering particles 824C are dispersed together in the base resin 624A of the blocking units 824, it is possible to suppress color mixture due to a low density of the dyes 624B or color mixture due to increase in the distance between the dyes 624B when the stretchable display device 800 is stretched. Accordingly, in the stretchable display device 800 according to the exemplary aspect of the present disclosure, the blocking units 824 are disposed between the sub-light-transmitting layers 421, in which the scattering particles 824C are dispersed, so that light of only one color can be transmitted in and exit from each of the sub-light-transmitting layers 421, thereby suppressing the color mixture of light.

The exemplary aspects of the present disclosure can also be described as follows:

According to an aspect of the present disclosure, there is provided a stretchable display device. The stretchable display device includes a plurality of island substrates spaced apart from one another and having a plurality of display elements disposed thereon, a lower substrate supporting the plurality of island substrates, a plurality of connection lines electrically connecting between the island substrates, and a light-transmitting unit disposed on the island substrates and the lower substrate. The light-transmitting unit transmits light from the display elements.

The light-transmitting unit may include a plurality of partition walls disposed on the connection lines and the lower substrate, the partition walls exposing a part of an upper surface of the connection lines and a part of an upper surface of the lower substrate, and a light-transmitting layer disposed over the partition walls and the island substrates. The partition walls, the light-transmitting layer, the lower substrate and the connection lines may be configured to have a plurality of voids.

A refractive index of the partition walls may be equal to or greater than a refractive index of the light-transmitting layer.

The light-transmitting layer may include a plurality of sub-light-transmitting layers spaced apart from one another.

Each of the sub-light-transmitting layers may overlap one of the display elements and some of the partition walls.

The light-transmitting layer may further include blocking units disposed between the sub-light-transmitting layers. Each of the blocking units may include a base resin and a plurality of dyes dispersed in the base resin.

Each of the blocking units may further include a plurality of scattering particles dispersed in the base resin.

The base resin may be made of a same material as the light-transmitting layer.

The partition walls may be in a mesh shape.

The plurality of display elements may be either inorganic light-emitting elements or organic light-emitting elements.

According to another aspect of the present disclosure, there is provided a stretchable display device. The stretchable display device includes a lower substrate comprising a plurality of rigid regions and a flexible region surrounding the rigid regions, a plurality of display elements disposed on the rigid regions, respectively, and a light-transmitting unit disposed on the lower substrate. The light-transmitting unit is configured to guide light emitted from the display elements to the flexible region so that a lattice pattern is suppressed that is possibly perceived by a viewer when the lower substrate is stretched.

The light-transmitting unit may include a light-transmitting layer for guiding light emitted from the plurality of display elements to the flexible region, and partition walls for changing a path of the light guided to the flexible region so that the light exits to outside.

The partition walls may be extended in a direction perpendicular to upper surfaces of the flexible region. A part of the upper surfaces of the flexible region may be exposed by the partition walls.

The light-transmitting layer may include a plurality of sub-light-transmitting layers, in each of which light emitted from a respective one of the plurality of display elements is guided. The sub-light-transmitting layer may be spaced apart from one another.

Each of the sub-light-transmitting layers may overlap with a respective one of the rigid regions and a part of the flexible region.

The light-transmitting layer may further include blocking units disposed between the sub-light transmitting layers. Each of the blocking units may include a base resin having a refractive index equal to a refractive index of the light-transmitting layer, and a plurality of dyes dispersed in the base resin.

Each of the blocking units may further include a plurality of scattering particles dispersed in the base resin. The scattering particles scatter light may incident on the blocking units to change a path of the light toward the dyes.

Each of the blocking units may be disposed between a plurality of emission zones. Lights emitted from the display elements may exit from the emission zones, respectively.

The sub-light transmitting layers may be disposed so that they overlap the emission zones emitting light of different colors, respectively.

The stretchable display device may further include a plurality of island substrates disposed on the plurality of rigid regions, respectively, and a plurality of connection lines disposed on the flexible region and electrically connecting between pads disposed on adjacent ones of the island substrates. The display elements may be disposed on the island substrates, respectively.

A modulus of the partition walls may be less than a modulus of the island substrates.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
a plurality of island substrates spaced apart from one another and having a plurality of display elements disposed thereon;
a lower substrate supporting the plurality of island substrates and the lower substrate being more flexible than the plurality of island substrates;
a plurality of connection lines electrically connecting between the island substrates; and
a light-transmitting unit disposed on the island substrates and the lower substrate and transmitting light from the plurality of display elements,
wherein the light-transmitting unit comprises:
a plurality of partition walls disposed on the connection lines and the lower substrate and exposing a part of the plurality of connection lines and a part of the lower substrate; and
a light-transmitting layer disposed over the partition walls and the plurality of island substrates,
wherein the plurality of partition walls, the light-transmitting layer, the lower substrate and the plurality of connection lines are configured to have a plurality of voids.

2. The display device of claim 1, wherein a refractive index of the plurality of partition walls is equal to or greater than a refractive index of the light-transmitting layer.

3. The display device of claim 1, wherein the light-transmitting layer comprises a plurality of sub-light-transmitting layers spaced apart from one another.

4. The display device of claim 3, wherein each of the sub-light-transmitting layers overlaps one of the display elements and some of the plurality of partition walls.

5. The display device of claim 3, wherein the light-transmitting layer further comprises a plurality of blocking units disposed between the sub-light-transmitting layers, wherein each of the plurality of blocking units comprises a base resin and a plurality of dyes dispersed in the base resin.

6. The display device of claim 5, wherein each of the plurality of blocking units further comprises a plurality of scattering particles dispersed in the base resin.

7. The display device of claim 5, wherein the base resin is made of a same material as the light-transmitting layer.

8. The display device of claim 1, wherein the plurality of partition walls have a mesh shape in a plan view.

9. The display device of claim 1, wherein the plurality of display elements includes inorganic light-emitting elements or organic light-emitting elements.

10. A display device comprising:
a lower substrate;
a plurality of island substrates disposed on the lower substrate;
a plurality of display elements disposed to respectively correspond to the plurality of island substrates;
a plurality of partition walls disposed on the lower substrate and configured to change a path of light emitted from the plurality of display elements; and
a light-transmitting layer disposed on the plurality of island substrates, the plurality of display elements and the plurality of partition walls and configured to guide the light emitted from the plurality of display elements.

11. The display device of claim 10, wherein the light-transmitting layer comprises a plurality of sub-light-transmitting layers and each sub-light-transmitting layer is spaced apart from each other and corresponds to a single display element of the plurality of display elements.

12. The display device of claim 10, further comprising a plurality of connection lines electrically connecting the plurality of island substrates.

13. The display device of claim 12, wherein the plurality of partition walls are disposed on the plurality of connection lines between the plurality of island substrates.

14. The display device of claim 12, wherein the plurality of partition walls have a mesh shape in a plan view and exposes a part of an upper surface of the plurality of connection lines and a part of an upper surface of the lower substrate.

15. The display device of claim 10, wherein a space between the plurality of partition walls is filled with air.

16. The display device of claim 11, wherein a space between the plurality of sub-light-transmitting layers is filled with a material having a refractive index lower than that of the plurality of sub-light-transmitting layers.

17. The display device of claim 16, wherein the space between the plurality of sub-light-transmitting layers is disposed on at least one of the plurality of display elements.

18. The display device of claim 11, wherein the plurality of sub-light-transmitting layer have a refractive index smaller than or equal to that of the plurality of partition walls.

19. The display device of claim 11, wherein the light-transmitting layer includes polydimethylsiloxane.

* * * * *